United States Patent
Cho et al.

(10) Patent No.: US 7,710,767 B2
(45) Date of Patent: May 4, 2010

(54) MEMORY CELL ARRAY BIASING METHOD AND A SEMICONDUCTOR MEMORY DEVICE

(75) Inventors: Beak-Hyung Cho, Hwaseong-si (KR); Do-Eung Kim, Yongin-si (KR); Choong-Keun Kwak, Suwon-si (KR); Sang-Beom Kang, Hwaseong-si (KR); Woo-Yeong Cho, Hwaseong-si (KR); Hyung-Rok Oh, Seongnam-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 179 days.

(21) Appl. No.: 11/969,326

(22) Filed: Jan. 4, 2008

(65) Prior Publication Data

US 2008/0165575 A1   Jul. 10, 2008

Related U.S. Application Data

(63) Continuation-in-part of application No. 11/327,967, filed on Jan. 9, 2006, now Pat. No. 7,317,655.

(30) Foreign Application Priority Data

Jan. 25, 2005   (KR) .............. 10-2005-0006581

(51) Int. Cl.
    *G11C 11/00* (2006.01)
(52) U.S. Cl. ..................... 365/163; 365/148
(58) Field of Classification Search ............ 365/175
    See application file for complete search history.

(56) References Cited

U.S. PATENT DOCUMENTS

| | | | | |
|---|---|---|---|---|
| 4,377,857 A | * | 3/1983 | Tickle | 365/185.33 |
| 4,831,589 A | * | 5/1989 | Brahmbhatt | 365/185.23 |
| 4,884,238 A | | 11/1989 | Lee et al. | |
| 4,903,236 A | * | 2/1990 | Nakayama et al. | 365/185.28 |
| 5,293,212 A | * | 3/1994 | Yamamoto et al. | 365/218 |
| 5,466,700 A | * | 11/1995 | Batenhorst et al. | 514/329 |
| 5,732,021 A | * | 3/1998 | Smayling et al. | 365/185.29 |
| 7,317,655 B2 | * | 1/2008 | Cho et al. | 365/230.06 |
| 7,548,446 B2 | * | 6/2009 | Kim et al. | 365/148 |

FOREIGN PATENT DOCUMENTS

WO    03/085675 A2    10/2003

OTHER PUBLICATIONS

Notice of First Office Action issued by the Chinese Patent Office on Feb. 6, 2009.

\* cited by examiner

*Primary Examiner*—Tan T. Nguyen
(74) *Attorney, Agent, or Firm*—F. Chau & Associates, LLC

(57) ABSTRACT

A method of biasing a memory cell array during a data writing operation and a semiconductor memory device, in which the semiconductor memory device includes: a memory cell array including a plurality of memory cells in which a first terminal of a memory cell is connected to a corresponding first line among a plurality of first lines and a second terminal of a memory cell is connected to a corresponding second line among a plurality of second lines; and a bias circuit for biasing a selected second line to a first voltage and non-selected second lines to a second voltage.

19 Claims, 4 Drawing Sheets

MEMORY CELL ARRAY BIASING METHOD AND A SEMICONDUCTOR MEMORY DEVICE

CROSS-REFERENCE TO RELATED APPLICATIONS

This application claims priority to Korean Patent Application No. 10-2005-0006581, filed on Jan. 25, 2005, in the Korean Intellectual Property Office, the disclosure of which is incorporated by reference herein in its entirety.

This application is a continuation-in-part of application Ser. No. 11/327,967 filed Jan. 9, 2006, now U.S. Pat. No. 7,317,655.

BACKGROUND OF THE INVENTION

1. Technical Field

The present disclosure relates to a semiconductor memory device, and more particularly, to a semiconductor memory device and a data writing method for controlling a biasing level of a memory cell array.

2. Discussion of Related Art

Phase change random access memories (PRAMs) are non-volatile memory devices that store data using a phase change material, e.g., Ge—Sb—Te (GST), whose resistance changes in accordance with a phase transition due to a change in temperature.

FIG. 1 illustrates an equivalent circuit of a unit cell C of a PRAM. Referring to FIG. 1, the unit cell C consists of a P-N diode D and a phase change material GST. The phase change material GST is connected to a bit line BL and a P-junction of the diode D. A word line WL is connected to an N-junction of the diode D.

The phase change material GST of the PRAM unit cell C, goes into a crystalline state or an amorphous state depending on a temperature applied thereto and a heating time. This enables data to be stored in the PRAM cell. In general, a temperature higher than 900° C. is needed for a phase transition of the phase change material GST. Such temperatures are obtained by Joule heating, which uses a current flowing through the PRAM cell to increase or decrease the temperature thereof.

A write operation for the phase change material GST will now be described. First, the phase change material GST is heated above its melting temperature by a current and then it is rapidly cooled. The phase change material GST then goes into the amorphous state and stores a data "1". This state is referred to as a reset state. The phase change material GST is then heated above its crystallization temperature for a predetermined period of time and cooled. Next, the phase change material GST goes into the crystalline state and stores a data "0". This state is referred to as a set state.

A read operation for the phase change material GST will now be described. After a bit line and a word line are used to select a memory cell, an external current is provided to the selected memory cell. It is then determined whether data to be stored in the selected memory cell is "1" or "0" based on a change in voltage according to a resistance value of the phase change material GST of the selected memory cell.

FIG. 2 illustrates a semiconductor memory device 200 comprising a memory cell array MAY including a plurality of the PRAM unit cells C shown in FIG. 1. An exemplary structure of the memory cell array MAY is disclosed in U.S. Pat. Nos. 6,667,900 and 6,567,296.

Referring to FIG. 2, the semiconductor memory device 200 comprises the memory cell array MAY and a word line driver 210. The memory cell array MAY comprises a plurality of unit cells C connected to corresponding bit lines BL0~BLk-1 and word lines WL0, WL1, and WL2. Although only k bit lines BL0~BLk-1 and three word lines WL0, WL1, and WL2 are shown in FIG. 2, the number of bit lines and word lines is not limited thereto.

For a data write operation, if one of the bit lines BL0~BLK-1 is first selected, the word line driver 210 selects one of the word lines WL0, WL1, and WL2. The selected word line is then set to a low level. If a first bit line BL0 and a first word line WL0 are sequentially selected, a write current applied to the first bit line BL0 flows through a unit cell connected between the first bit line BL0 and the first word line WL0. The state of the phase change material of the unit cell is then changed to store data.

Each of the word lines WL0, WL1, and WL2 has its own resistance R_WL. Because the word lines WL0, WL1, and WL2 pass current when writing data, the resistance R_WL should be minimized. Because the word lines WL0, WL1, and WL2 have a high resistance, however, the number of unit cells connected to the word lines WL0, WL1, and WL2 is limited. Further, the word line driver 210 should be powerful enough to drive the word lines WL0, WL1, and WL2.

When data is written to the unit cell connected between the first bit line BL0 and the first word line WL0, the write current is applied to the first bit line BL0, and the first word line WL0 is set to a low level by the word line driver 210. The second and third word lines WL1 and WL2 are then in a floating state. The first bit line BL0 maintains a relatively high voltage due to the applied write current, and the second and third word lines WL1 and WL2 maintain a relatively low level in the floating state. Therefore, current flows through unit cells connected between the first word line WL0 and the second and third word lines WL1 and WL2 which can change the state of the phase change material in those unit cells.

Because current may flow through unselected word lines that are floating, it is difficult to increase the operating speed of the semiconductor memory device and perform stable sensing. As such, a need exists for a semiconductor memory device that is capable of performing a stable sensing operation while increasing its operating speed.

SUMMARY OF THE INVENTION

A semiconductor memory device and a data writing method are provided that prevent current from flowing from a selected bit line to a non-selected word line by maintaining a constant voltage in the non-selected word line, thereby enabling stable sensing and increasing the operating speed of the semiconductor memory device.

According to an aspect of the present invention, there is provided a semiconductor memory device comprising: a memory cell array including a plurality of memory cells in which a first terminal of a memory cell is connected to a corresponding first line among a plurality of first lines and a second terminal of a memory cell is connected to a corresponding second line among a plurality of second lines; and bias circuits for biasing a selected second line among the second lines to a first voltage and a non-selected second line to a second voltage.

The first voltage may be connected to a local WL address decoder and the second voltage may be a pumping voltage higher than a power supply voltage. The bias circuits may comprise: NMOS transistors connected between the second lines and the address decoder; and PMOS transistors connected between the second lines and the pumping voltage.

Drains of the NMOS transistors may be connected to the second lines, sources are connected to the address decoder, and main word line signals are applied to gates of the NMOS transistors; and drains of the PMOS transistors are connected to the second lines, sources are connected to the pumping voltage, and the main word line signals are applied to gates of the PMOS transistors.

The semiconductor memory device may further comprise: a word line driver which generates the main word line signals in response to a word line enable signal and a block address.

The semiconductor memory device may further comprise: diode transistors connected between the pumping voltage and the PMOS transistors. The second voltage may be obtained by subtracting a threshold voltage of the diode transistors from the pumping voltage.

The bias circuits may comprise inverters for biasing the selected second line to the first voltage in response to the main word line signals. The semiconductor memory device may further comprise: a word line driver which generates the main word line signals in response to a word line enable signal and a block address. Each memory cell may comprise: a phase change material connected to one of the first lines; and a diode connected between the phase change material and one of the second lines.

According to another aspect of the present invention, there is provided a method of writing data to a selected memory cell connected to a selected first line and a selected second line of a semiconductor memory device including a plurality of memory cells in which a first terminal of a memory cell is connected to a corresponding first line among a plurality of first lines and a second terminal of a memory cell is connected to a corresponding second line among a plurality of second lines, the method comprising: biasing the selected first line to a predetermined voltage; biasing the selected second line to a first voltage; and basing non-selected second lines to a second voltage.

According to still another aspect of the present invention, there is provided a semiconductor memory device comprising: a plurality of first lines and a plurality of second lines; and a memory cell array including a plurality of memory cells in which a first terminal of a memory cell is connected to a corresponding one of the first lines and a second terminal of the memory cell is connected to a corresponding one of the second lines; wherein a selected second line is biased to a first voltage; and non-selected second lines are biased to a second voltage.

The semiconductor memory device may further comprise: bias circuits which control the voltage of the second lines: wherein the bias circuits comprise: NMOS transistors which bias the selected second line to the first voltage; and PMOS transistors which bias non-selected second lines to the second voltage.

According to yet another aspect of the present invention, there is provided a semiconductor memory device comprising: a memory cell array including a plurality of phase change memory cells in which a first terminal of a phase change memory cell is connected to a corresponding first line among a plurality of first lines and a second terminal of a phase change memory cell is connected to a corresponding second line among a plurality of second lines, and inverters for biasing a selected second line to a first voltage and non-selected second lines to a second voltage in response to main word line signals. Input terminals of the inverters may receive the main word line signals, and output terminals of the inverters are connected to the second lines.

BRIEF DESCRIPTION OF THE DRAWINGS

The above and other features of the present invention will become more apparent by describing in detail exemplary embodiments thereof with reference to the attached drawings in which.

DETAILED DESCRIPTION OF EXEMPLARY EMBODIMENTS

Figure 1:
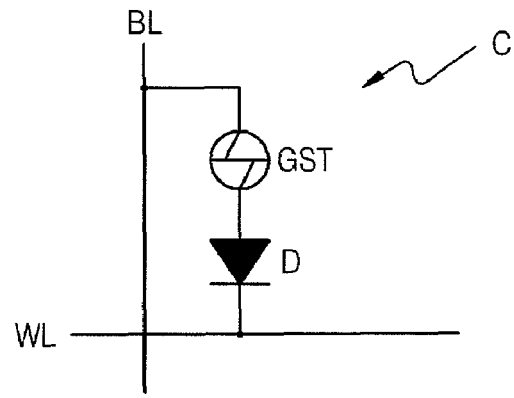
FIG. 1 illustrates an equivalent circuit of a unit cell of a PRAM.
Figure 2:
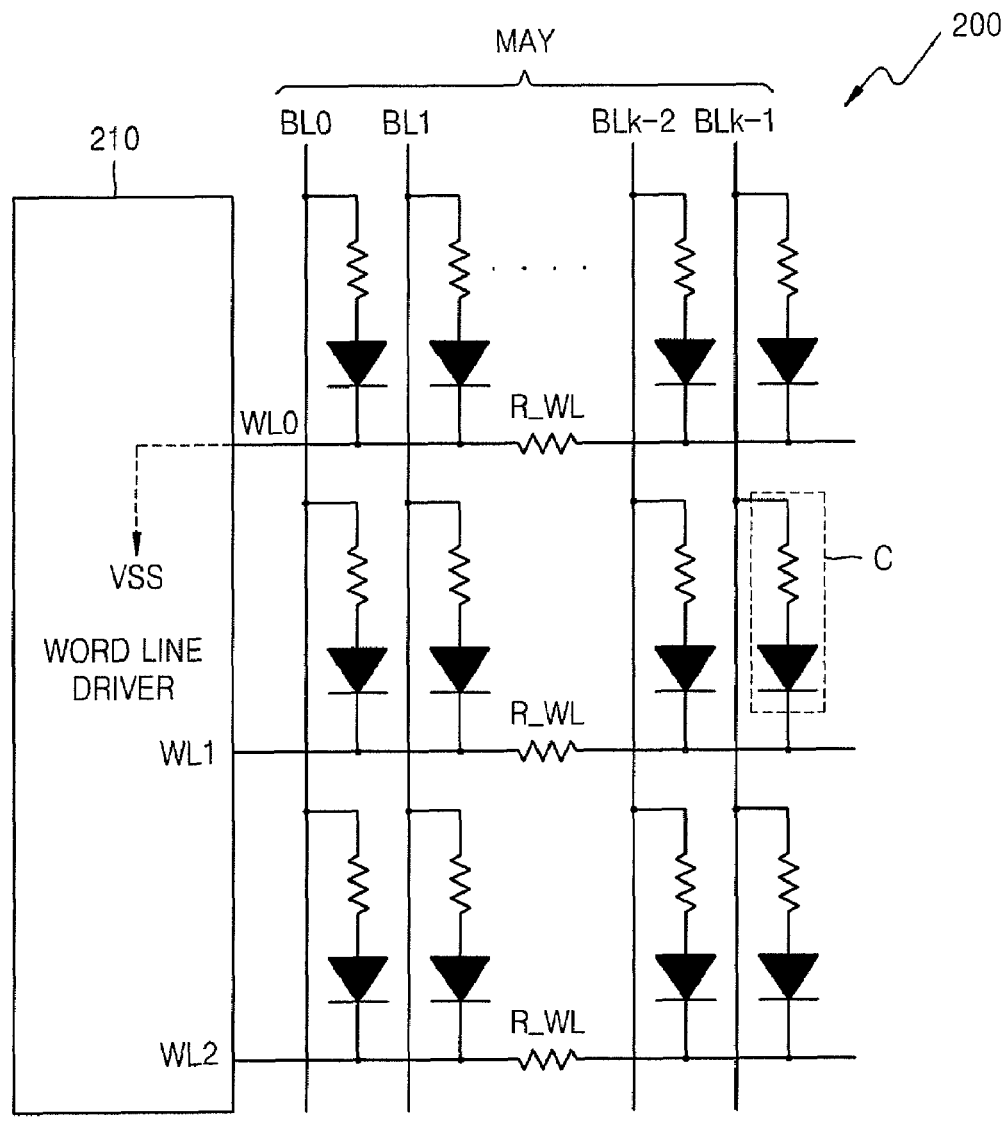
FIG. 2 illustrates a semiconductor memory device comprising a memory cell array including a plurality of the unit cells shown in FIG. 1.

The present invention will now be described more fully with reference to the accompanying drawings, in which exemplary embodiments of the invention are shown. Like reference numerals represent like elements throughout the drawings.

Figure 3:
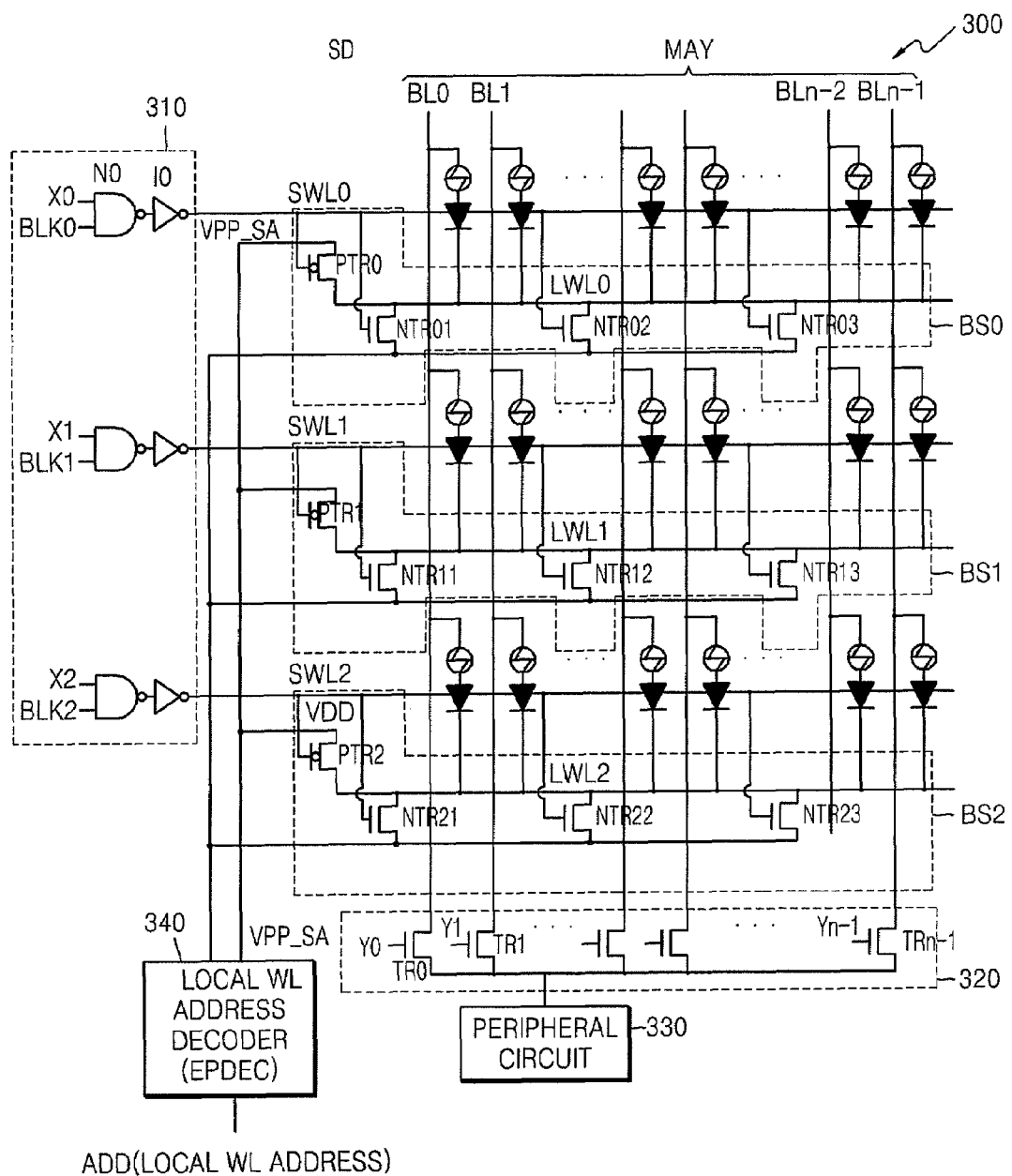
FIG. 3 illustrates a semiconductor memory device according to an exemplary embodiment of the present invention.

FIG. 3 illustrates a semiconductor memory device 300 according to an exemplary embodiment of the present invention. Referring to FIG. 3, the semiconductor memory device 300 includes a memory cell array MAY, bias circuits BS0, BS1, and BS2, and a word line driver 310. The semiconductor memory device 300 is a PRAM, which includes a memory cell having a phase change materials e.g. GST, connected to a first line, and a diode connected between the phase change material and a second line. The PRAM may be similar to or the same as that shown in FIG. 1.

As shown in FIG. 3, the semiconductor memory device 300 is connected to a peripheral circuit 330, a column decoder 320, and a local word time address decoder 340. The peripheral circuit 330 may comprise a write driver (not shown) and a sense amplification circuit (not shown). The column decoder 320 includes transistors TR0, TR1~TRn-1 which are turned on or off in response to column selection signals Y0~Yn-1. The local word line address decoder 340 receives the local word line address ADD.

The memory cell array MAY includes a plurality of memory cells in which a first terminal of a memory cell is connected to a corresponding first line among a plurality of n first lines BL0~BLn-1, where n is a natural number, and a second terminal of the memory cell is connected to a corresponding second line among a plurality of second lines LWL0, LWL1, and LWL2. The plurality of first lines BL0~BLn-1 are bit lines and the plurality of second lines LWL0, LWL1 and LWL2 are word lines.

Even though only three second lines LWL0, LWL1, and LWL2 are shown in FIG. 3 the number of second lines is not limited thereto.

The bias circuits BS0, BS1, and BS2 bias a selected second line to a first voltage and a non-selected second line to a second voltage. The first voltage is a voltage provided by decoding the local word line address ADD from the local word line address decoder 340 and the second voltage is pumping voltage VPP-SA. The term "selected" means that the corresponding second line is activated by the word line driver 310 to write data to the memory cell connected to the second line.

The semiconductor memory device 300 maintains the voltage of a selected word line at the word line voltage, and prevents non-selected word lines from floating, thereby preventing a current from flowing from a selected bit line to the non-selected word line. In this way, the semiconductor memory device 300 can perform stable sensing, and increase its operating speed.

As further shown in FIG. 3, the bias circuits BS0, BS1, and BS2 comprise NMOS transistors NTR01~NTR23 connected between each of the second lines LWL0, LWL1, and LWL2 and the word line voltage from the local address word line decoder 340, and PMOS transistors PTR0, PTR1, PTR2 connected between each of the second lines LWL0, LWL1, and LWL2 and the pumping voltage VPP_SA. The pumping voltage VPP_SA is selected to be higher than the typical power supply voltage VDD used in the other exemplary embodiments described hereinafter.

Even though only three NMOS transistors are connected to each of the second lines LWL0, LWL1, and LWL2, the number of NMOS transistors is not limited thereto. In addition, the number of NMOS transistors can vary according to the number of memory cells connected to the second lines LWL0, LWL1, and LWL2 and the length of the second lines LWL0, LWL1, and LWL2.

The structure and operation of the bias circuits BS0, BS1, and BS2 will now be described in more detail. The drains of the NMOS transistors NTR01~NTR23 are connected to the second lines LWL0, LWL1, and LWL2, and the sources are connected to the local address word line voltage, and main word line signals SWL0, SWL1, and SWL2 are applied to the gates of the NMOS transistors NTR01~NTR23.

The word line driver 310 generates the main word line signals SWL0, SWL1, and SWL2 in response to word line enable signals X0, X1, and X2 and block addresses BLK0, BLK1, and BLK2. A main word line signal corresponding to a selected second line has a high level, and a main word line signal corresponding to a non-selected second line has a low level.

For example, when a first column selection signal Y0 of the column decoder 320 is activated to turn on a first transistor TR0, a write current is applied to a first bit line BL0. Data is then written to a memory cell connected between the first bit line BL0 and a first word line LWL0 (which may be a local word line).

If the word line enable signal X0 and the first block address BLK0 are input at a high level, a NAND gate N0 and an inverter I0 generate the first main word line signal SWL0 at a high level. The first main word line signal SWL0 is then generated at a high level and the other main word line signals SLW1 and SWL2 are generated at a low level to select the first word line LWL0.

The NMOS transistors NTR01~NTR23 of the first bias circuit BS0 are turned on in response to the high level of the first main word line signal SWL0, and the first word line LWL0 goes to a low level.

The PMOS transistor PTR0 of the first bias circuit BS0 is turned off. The write current applied to the first bit line BL0 flows to the word line decoder 340 through a memory cell and the first word line LWL0 so that data is stored in the memory cell.

The PMOS transistors PTR1 and PTR2 of the second and third bias circuits BS1 and BS2 are turned on by the second and third main word line signals SWL1 and SWL2 at a low level, and the voltage of the second and third word lines LWL1 and LWL2 becomes the pumping voltage VPP_SA.

The write current applied to the first bit line BL0 does not flow to the second and third word lines LWL1 and LWL2 since the second and third word lines LWL1 and LWL2 are at the pumping voltage VPP_SA. Thus, memory cells other than that connected to the first bit line BL0 and the first word line LWL0 can stably hold data since they are not influenced by the write current of the first bit line BL0.

As a further operational example, assuming that the word line LWL0 and the bit line BL0 are selected, local word line address decoder EPDEC applies 0V to the source of NMOS transistor NTR01 that is connected to the selected word line LWL0. In this case, a current path is generated from the selected bit line BL0 to the source of selected NMOS transistor NTR01.

Assuming that the word line LWL1 is not selected, however, and the bit line BL0 is selected, local word line address decoder EPDEC applies the pumping voltage VPP_SA to the source of NMOS transistor NTR11 that is connected to the un-selected word line LWL1. In this case, a voltage drop corresponding to the threshold voltage of the un-selected NMOS transistor NTR11 is generated, and accordingly the first voltage that is obtained by subtracting the threshold voltage of the un-selected NMOS transistor NTR11 from the pumping voltage VPP_SA is applied to the un-selected word line LWL1.

That is, the first voltage is applied to one terminal of the diode that is connected to the un-selected word line LWL1, and the voltage of the selected bit line BL0 that is applied to the other terminal of the diode is the voltage of the selected bit line BL0.

In this exemplary embodiment, it is the pumping voltage VPP_SA that is greater than the threshold voltage of the un-selected NMOS transistor NTR11 plus the voltage of the selected bit line BL0. Therefore, the diode of the PRAM cell is in the off state, and accordingly leakage current in the diode is not generated.

Assuming that the power supply voltage VDD of subsequently described embodiments, which is lower than the pumping voltage VPP_SA, is used, however, the diode of the PRAM cell may be in the on state. Accordingly, leakage current in the diode may be generated.

Figure 4:
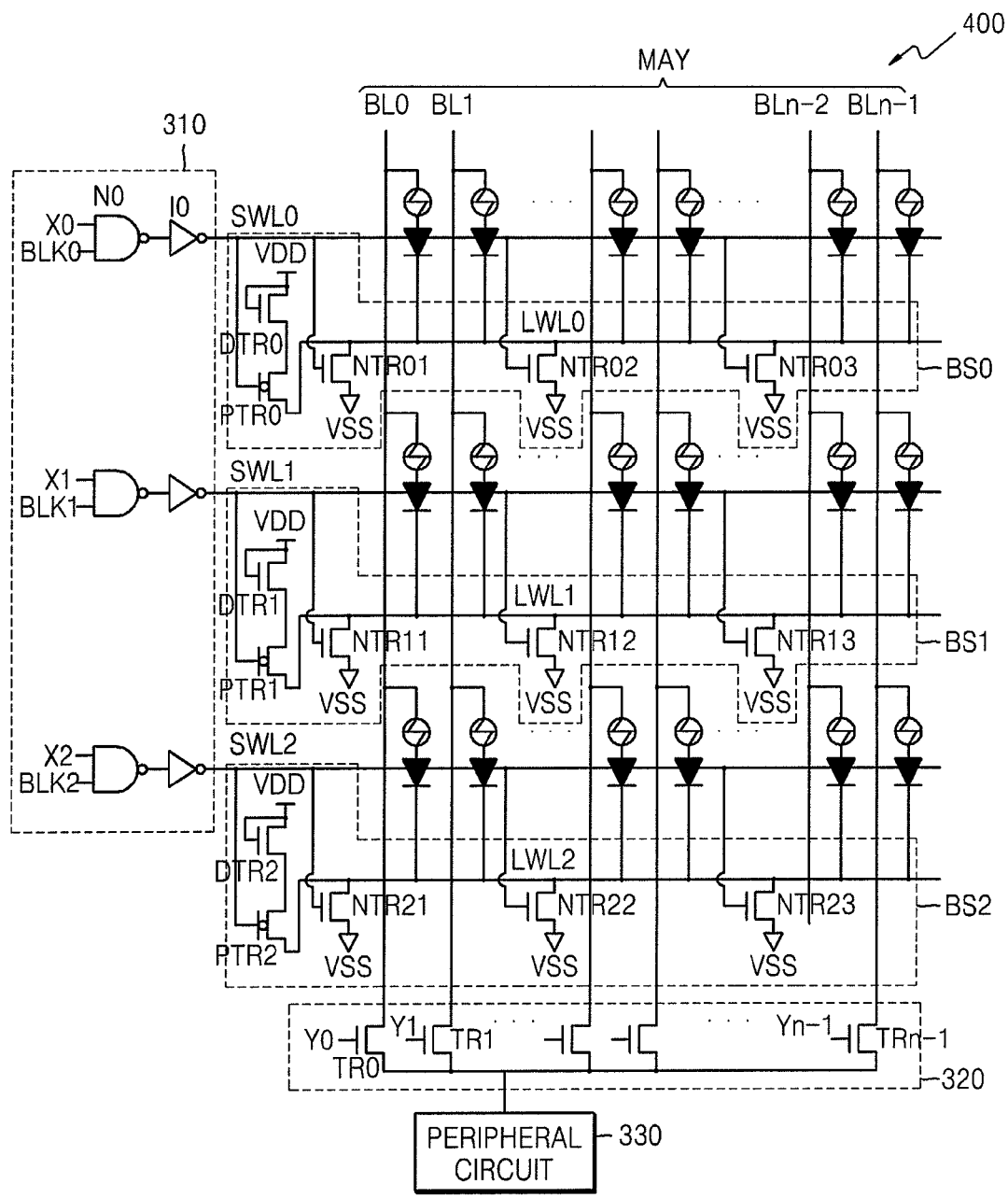
FIG. 4 illustrates another semiconductor memory device according to an exemplary embodiment of the present invention.

FIG. 4 illustrates a semiconductor memory device 400 according to another embodiment of the present invention. The semiconductor memory device 400 has the same or similar structure and operation as the semiconductor memory device 300 shown in FIG. 3. However, the structure of bias circuits BS0, BS1, and BS2 of the semiconductor memory device 400 is different than that of the bias circuits BS0, BS1, and BS2 of the semiconductor memory device 300.

For example, the bias circuits BS0, BS1, and BS2 of the semiconductor memory device 400 include diode transistors DTR0, DTR1, and DTR2 connected between the power voltage VDD and the sources of the PMOS transistors PTR0, PTR1, and PTR2. Word lines (e.g. the second and third word lines LWL1 and LWL2) which are not selected by the diode transistors DTR0, DTR1, and DTR2 are at a voltage obtained by subtracting the threshold voltage of the diode transistors DTR0, DTR1, and DTR2 from the power voltage VDD.

In FIG. 4, the voltage applied to a bit line to create the write current is lower than the power voltage VDD and non-selected word lines maintain a voltage lower than the power voltage VDD.

Figure 5:
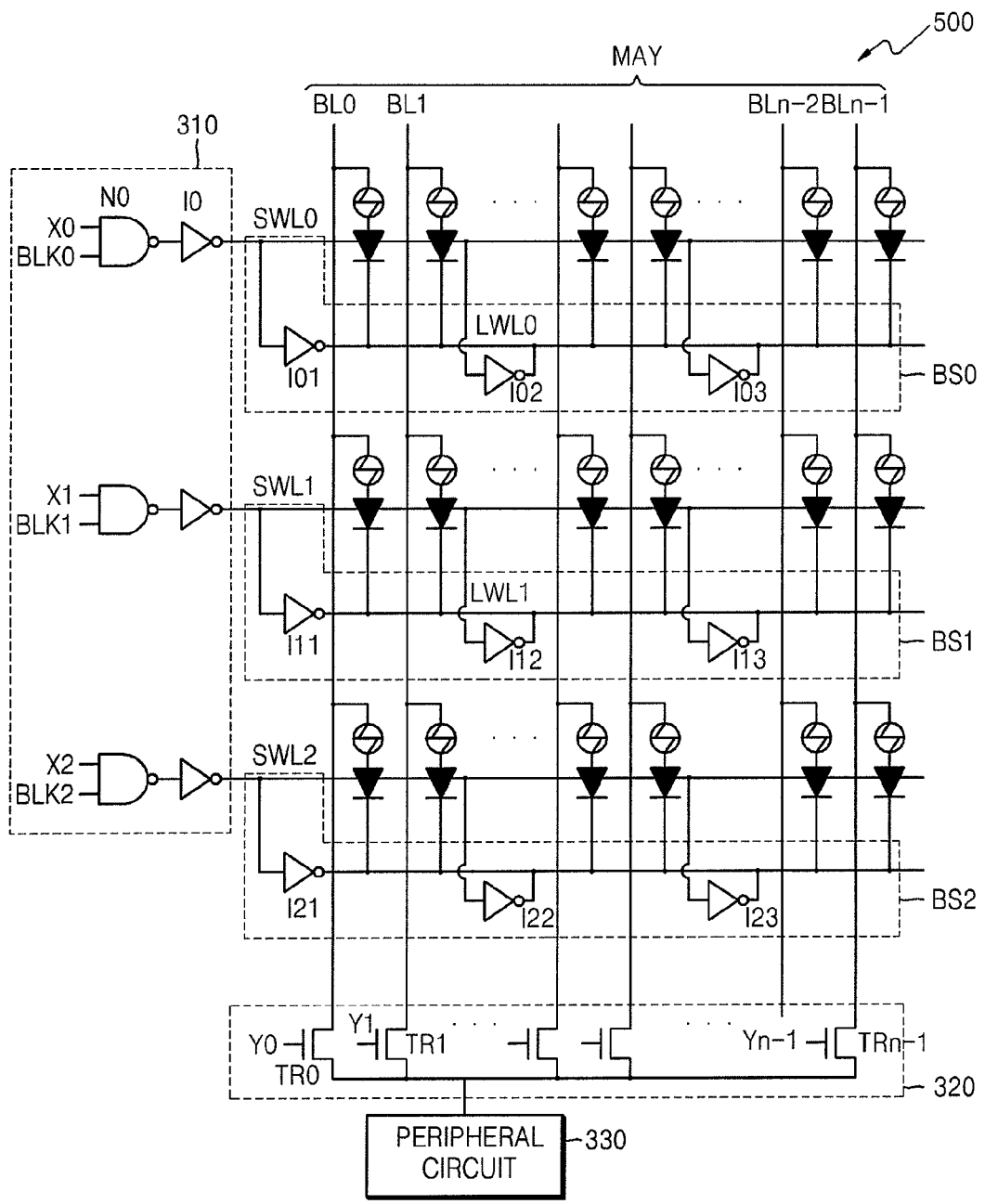
FIG. 5 illustrates still another semiconductor memory device according to an exemplary embodiment of the present invention.

FIG. 5 illustrates still another semiconductor memory device 500 according to an embodiment of the present invention. The semiconductor memory device 500 has the same or similar structure as the semiconductor memory device 300 shown in FIG. 3. However, the structure of bias circuits BS0, BS1 and BS2 of the semiconductor memory device 500 is different than that of the bias circuits BS0, BS1, and BS2 of the semiconductor memory device 300.

As shown in FIG. 4, the bias circuits BS0, BS1, and BS2 of the semiconductor memory device 500 include inverters I01~I23 for biasing a selected second line to a first voltage in response to the main word line signals SWL0, SWL1, and SWL2. The inverters I01~I23 perform the functions of the NMOS transistors NTR01~NTR23 and the PMOS transistors PTR0, PTR1, PTR2 included in the bias circuits BS0, BS1, and BS2 shown in FIG. 3. For example, the main word line signal SWL0 is generated at a high level, and other main word line signals SWL1 and SWL2 are generated at a low level.

The inverters I01, I02 and I03 of the first bias circuit BS0 invert the voltage of the first word line LWL0 to a low level. The inverters I11~I23 of the second and third bias circuits BS1 and BS2 invert the voltage of the second and third word lines LWL2 and LWL3 to a high level. The bias circuits BS0, BS1, and BS2 of the semiconductor memory device 500 perform the same or similar function as the bias circuits BS0, BS1, and BS2 of the semiconductor memory device 300.

A data writing method according to an embodiment of the present invention will now be described. The data writing method may be used by one of the semiconductor memory devices 300, 400 or 500. In addition, the data writing method may be used by a semiconductor memory device other than the semiconductor memory devices 300, 400 or 500 that includes a plurality of memory cells, in which a first terminal of a memory cell is connected to a corresponding first line among a plurality of first lines, and a second terminal connected to a corresponding second line among a plurality of second lines.

In the data writing method, data is written to a selected memory cell connected to a selected first line and a selected second line of a semiconductor memory device. In more detail, the selected first line is biased to a predetermined voltage and the first line is a bit line and the selected first line is a bit line connected to a memory cell for applying data.

A write current for writing data is then applied to a bit line and the selected second line is biased to a first voltage. The selected second line is a word line connected to a memory cell for writing data. The first voltage lowers the voltage of the word line connected to the memory cell for writing data.

Non-selected second lines are biased to a second voltage and the non-selected second lines are word lines other than the word line connected to the memory cell for writing data. The second voltage lowers the voltage of non-selected second lines other than the word line connected to the memory cell for writing data. In this way, a current is prevented from flowing from a selected bit line to a non-selected word tine.

While the present invention has been particularly shown and described with reference to exemplary embodiments thereof it will be understood by those of ordinary skill in the art that various changes in form and details may be made therein without departing from the spirit and scope of the present invention as defined by the following claims.

What is claimed is:

1. A semiconductor memory device comprising:
a memory cell array including a plurality of memory cells in which a first terminal of a memory cell is connected to a corresponding first line of a plurality of first lines and a second terminal of the memory cell is connected to a corresponding second line of a plurality of second lines, wherein each memory cell comprises a phase change material connected to one of the first lines and a diode connected between the phase change material and one of the second lines;
a bias circuit for biasing a selected second line of the second lines to a first voltage and a non-selected second line to a second voltage, wherein the first voltage is a decoded word line address voltage and the second voltage is a pumping voltage; and
a local word line address decoder applying the pumping voltage to the bias circuit.

2. The semiconductor memory device of claim 1, wherein the bias circuit comprises:
NMOS transistors connected between the second lines and the first voltage; and
PMOS transistors connected between the second lines and the pumping voltage.

3. The semiconductor memory device of claim 2, wherein drains of the NMOS transistors are connected to the second lines, sources are connected to the decoded word line address voltage, and main word line signals are applied to gates of the NMOS transistors; and
drains of the PMOS transistors are connected to the second lines, sources are connected to the pumping voltage, and the main word line signals are applied to gates of the PMOS transistors.

4. The semiconductor memory device of claim 3, further comprising:
a word line driver which generates the main word line signals in response to a word line enable signal and a block address.

5. The semiconductor memory device of claim 2, further comprising
diode transistors connected between the pumping voltage and the PMOS transistors.

6. The semiconductor memory device of claim 5, wherein the second voltage is obtained by subtracting a threshold voltage of the diode transistors from the pumping voltage.

7. The semiconductor memory device of claim 1, wherein the bias circuit comprises:
inverters for biasing the selected second line to the first voltage in response to main word line signals.

8. The semiconductor memory device of claim 7, further comprising:
a word line driver which generates the main word line signals in response to a word line enable signal and a block address.

9. The semiconductor memory device of claim 1, wherein the first lines are bit lines and the second lines are word lines.

10. A method of writing data to a selected memory cell connected to a selected first line and a selected second line of a semiconductor memory device including a plurality of memory cells in which a first terminal of a memory cell is connected to a corresponding first line of a plurality of first lines and a second terminal of the memory cell is connected to a corresponding second line of a plurality of second lines the method comprising:
biasing the selected first line to a predetermined voltage;
biasing the selected second line to a first voltage;
basing non-selected second lines to a second voltage, wherein the first voltage is a decoded word line address voltage and the second voltage is a pumping voltage, wherein each memory cell comprises a phase change material connected to one of the first lines and a diode connected between the phase change material and one of the second lines; and
applying the pumping voltage to a bias circuit with a local word line address decoder.

11. A semiconductor memory device comprising:
a plurality of first lines and a plurality of second lines;
a memory cell array including a plurality of memory cells in which a first terminal of a memory cell is connected to a corresponding one of the first lines and a second terminal of a memory cell is connected to a corresponding one of the second lines, wherein each memory cell comprises a phase change material connected to one of the first lines and a diode connected between the phase change material and one of the second lines; and
bias circuits which control voltages of the second lines;
wherein a selected second line is biased to a first voltage;
non-selected second lines are biased to a second voltage, wherein the first voltage is a decoded word line address voltage and the second voltage is a pumping voltage; and
a local word line address decoder applies the pumping voltage to the bias circuits.

12. The semiconductor memory device of claim 11, wherein the bias circuits comprise:
NMOS transistors which bias the selected second line to the first voltage; and
PMOS transistors which bias the non-selected second lines to the second voltage.

13. The semiconductor memory device of claim 12, wherein drains of the NMOS transistors are connected to the second lines, sources are connected to the decoded word line address voltage, and main word line signals are applied to gates of the NMOS transistors; and
drains of the PMOS transistors are connected to the second lines, sources are connected to the pumping voltage, and the main word line signals are applied to gates of the PMOS transistors.

14. The semiconductor memory device of claim 12, further comprising:
diode transistors connected between the pumping voltage and the PMOS transistors.

15. The semiconductor memory device of claim 14, wherein the second voltage is obtained by subtracting a threshold voltage of the diode transistors from the pumping voltage.

16. The semiconductor memory device of claim 12, further comprising:
a word line driver which generates main word line signals in response to a word line enable signal and a block address.

17. A semiconductor memory device comprising:
a memory cell array including a plurality of phase change memory cells in which a first terminal of a phase change memory cell is connected to a corresponding first line of a plurality of first lines and a second terminal of a phase change memory cell is connected to a corresponding second line of a plurality of second lines; and
inverters for biasing a selected second line to a first voltage and non-selected second lines to a second voltage in response to main word line signals,
wherein the first voltage is a decoded word line address voltage and the second voltage is a pumping voltage.

18. The semiconductor memory device of claim 17, wherein input terminals of the inverters receive the main word line signals, and output terminals of the inverters are connected to the second lines,
a main word line signal corresponding to the selected second line is at a high level; and
main word line signals corresponding to non-selected second lines are at a low level.

19. The semiconductor memory device of claim 18, further comprising:
a word line driver which generates the main word line signals in response to a word line enable signal and a block address.

* * * * *